United States Patent [19]

Chien

[11] Patent Number: 5,024,894

[45] Date of Patent: Jun. 18, 1991

[54] METHOD OF PRODUCING SILICON AND SIMILAR WAFERS BUFFERED FOR THE DEPOSITION OF METAL OXIDE SUPERCONDUCTING (MOS) POLYMER COMPOSITES AND THE LIKE BY INSULATING METAL OXIDES (IMO) SUITABLE AS SUBSTRATES FOR MOS, AND NOVEL BUFFERED WAFERS PROVIDED THEREBY

[75] Inventor: James C. W. Chien, Amherst, Mass.

[73] Assignee: Academy of Applied Science, Concord, N.H. ; a part interest

[21] Appl. No.: 407,912

[22] Filed: Sep. 15, 1989

Related U.S. Application Data

[63] Continuation-in-part of Ser. No. 266,014, Nov. 2, 1988.

[51] Int. Cl.$^5$ ................................................ B32B 9/00
[52] U.S. Cl. .................................... 428/433; 428/457; 428/688; 428/901; 428/930; 505/701; 427/62
[58] Field of Search ............... 428/209, 426, 433, 457, 428/688, 901, 930; 505/1, 701.4; 427/62

[56] References Cited

PUBLICATIONS

James C. W. Chien, "Polymer Precursor Synthesis of High T$_c$ Superconductors", Polymer Bulletin 21, 1–4 (1989).
James C. W. Chien and B. M. Gong, "Polymer Precursor Synthesis and Characterization of YBa$_2$CU$_3$O$_{7-x}$", Physical Review B, vol. 38, No. 16, Dec. 1, 1988.

*Primary Examiner*—Patrick J. Ryan
*Attorney, Agent, or Firm*—Rines and Rines

[57] ABSTRACT

New Method of buffering silicon and similar semiconductor wafers with appropriate metal oxide layers which, in turn, have been found to be excellent substrates for MOS depositions without interaction with the semiconductor surface, and novel buffered wafers produced thereby.

9 Claims, No Drawings

METHOD OF PRODUCING SILICON AND SIMILAR WAFERS BUFFERED FOR THE DEPOSITION OF METAL OXIDE SUPERCONDUCTING (MOS) POLYMER COMPOSITES AND THE LIKE BY INSULATING METAL OXIDES (IMO) SUITABLE AS SUBSTRATES FOR MOS, AND NOVEL BUFFERED WAFERS PROVIDED THEREBY

The present invention relates to silicon (si) or similar wafers useful in integrated circuit (IC), VLIC and similar applications, provided with layers of metal oxide superconducting (MOS) polymer composites and the like, being a continuation-in-part of U.S. application Ser. No. 266,014 filed Nov. 2, 1988, for a Method of Producing Metal Oxide Super-Conducting Polymer Composites Wherein Radiation-Sensitive Resist Polymer-Metal-Complex Precursors Form Interconnected Superconducting Pathways for Integrated Circuit and Similar Applications; and Products Prepared Thereby.

With the constant demands for higher density of circuitry in VLIC applications, the use of superconducting VLIC devices appears to be an ultimate answer. This requires depositing metal oxide superconductor (MOS) patterns on Si wafers (or GaAs or other semiconductor wafers and the like).

In said copending U.S. Pat. application Ser. No. 266,014, there is disclosed such a process to form integrated circuits on a silicon semiconductor or other suitable substrate in which circuit components can be formed that comprises applying to a major surface of the substrate, as a thin-layer composite, a resist in the form of a polymer-metal-complex (PMC) precursor which includes materials that can be made superconducting (MOS) and at least one thermally stable heteratom resist polymer (HRP) intermixed. The thin-layer composite is irradiated to achieve selective removal of portions of the thin-layer composite, whereby many electrical devices can be formed in the substrate; and then the polymer-metal-complex (PMC) precursor is oxidatively processed to convert the precursor to a metal-oxide-superconductor (MOS) to carry electric current between said devices The heteroatom resist polymer (HRP) may comprise a large number of successive aromatic rings with intervening structures that destroy the colinear character and coplanar character typical of the successive aromatic rings to render the heteroatom (HRP) sensitive to and unstable in the presence of radiation used to create integrated electrical circuits, yet stable at temperatures used to create integrated circuits and stable in common organic solvents; and it may comprise a copolymer containing both partially and completely condensed structure units taken from the group consisting essentially of amic acid, imide, imidazole, oxadiazole, triazole and oxazole and their precursor groups. The heteroatom resist polymer (HRP) may also be a synthetic polymer taken from the group consisting of negatively-charged carboxylate and solfonate, or a synthetic polymer taken from a group of polymers having polar groups of amide, ester, hydroxy, ether and sulfide. The polymer-metal-complex (PMC) may include metals taken from the group consisting of Y, Ba, Bi, Sr, Ca, Tl, Pb, Ag and Cu.

While initial experiments have proved most encouraging with this technique, as described, for example, in my articles "Polymer Precursor Synthesis of High $T_c$ Superconductors", Polymer Bulletin 21, 1–4 (1989) and "Polymer Precursor Synthesis and Characterization of $YBa_2, Cu_3, O_{7-x}$", Physical Review B, Vol. 38, No. 6, 1 Dec. 1988, pp. 11853–6, in some of the more stringent uses of applications of MOS deposition on Si wafers and the like, particularly with other techniques than above discussed, several difficulties may arise. Specifically, it has been found that the silicon is highly reactive with the metal ions of MOS, forming metal silicides. These reactions have been found to occur even for Si wafers having their surfaces oxidized to $SiO_2$ in view of the fact that Si atoms have high diffusivity in $SiO_2$. On the other hand, thin films of MOS have been successfully deposited on certain insulating metal oxides (IMO) substrates, such as $LaAlO_3$, $LaGaO_3$, $ZrO_2$, $SrTiO_3$, $MgO$, and have been shown to exhibit $>10^6 A\ cm^{-2}$ current density as described in said copending application and articles.

It has now been discovered that, using the polymer-metal-complex (PMC) precursor technique of said articles and copending application, metal oxide-buffered Si and related semiconductor wafers can be made which serve admirably as substrates for depositing single and multilayer MOS patterns.

An object of the present invention, accordingly, is to provide a new method of buffering silicon and similar semiconductor wafers with appropriate IMO layers which, in turn, have been found to be excellent substrates for MOS depositions without interaction with the semiconductor surface, and novel buffered wafers produced thereby.

Other and further objects will be explained hereinafter and are more particularly delineated in the appended claims.

In summary, from one of its aspects, the invention embraces a method of buffering semiconductor wafers from interaction with metal oxide superconducting (MOS) materials to be deposited upon a surface thereof, that comprises, applying to the semiconductor wafer surface a coating of polymer-metal-complex (PMC) to form thereon a corresponding IMO, preferably 0.1 to 10 $\mu m$ thickness, thin layer adhered to the said wafer surface and non-reactive therewith, said layer being adapted to receive MOS deposition thereupon and buffering the same from reaction with the wafer surface. Preferred and best mode embodiments are hereinafter described.

Ten grams of $Mg(NO_3)_2 6H_2O$ and 20 g of copolymer of vinylacetate and methacrylic acid was dissolved in 100 g of dimethyl formamide (DMF) spin coating the PMC solution on a silicon wafer at 4000 rph for 1 minute. About 1.4 $\mu m$ thick film of PMC precursor was thereby obtained. It was heated under an air atmosphere from room temperature to 700° C. in 2 hours and then maintained at 700° C. for 0.5 hour. A very smooth MgO insulating buffer layer 0.2 $\mu m$ thin was obtained, well-adhered to and non-reactive with the silicon surface and providing an excellent substrate for MOS deposition thereon without interaction with the silicon surface.

I have also successfully prepared buffered Si wafers of other insulating-type metal oxides known to be good substrates for MOS by this same process using other functional copolymers such as polyamic acid. These examples are given in Table I below. The buffered wafers are free of pinholes and can readily be used to prepare superconductive VLIC structures as explained above.

TABLE I

Preparations of buffered Si wafers
Composition of Precursors

| Buffer | Compound | | Co-polymer | DMF | $HNO_3$ |
|---|---|---|---|---|---|
| MgO | $Mg(NO_3)_2 \cdot 6H_2O$ | 10 g | 20 g | 100 g | 0 g |
| $LaGaO_3$ | $La(NO_3)_2 6H_2O$ | 1.732 g | 4.2 g | 50 g | 1.0 g |
| | $Ga(NO_3)_3$ | 1.023 g | | | |
| $SrTiO_3$ | $Sr(NO_3)_2$ | 2.12 g | 5.0 g | 60 g | 1.0 g |
| | $(C_5H_5)_2TiCl_2$ | 2.49 g | | | |
| $NdGaO_3$ | $Nd(NO_3)_3 5H_2O$ | 0.408 g | 1.4 g | 20 g | 1.0 g |
| | $Ga(NO_3)_3$ | 2.255 g | | | |
| GdGa | $Gd(NO_3)_3 \cdot 5H_2O$ | 0.451 g | 1.4 g | 20 g | 1.0 g |
| | $Ga(NO_3)_3$ | 2.255 g | | | |
| YSZ | $Y(NO_3) \cdot 5H_2O$ | 0.628 g | 7.8 g | 50 g | 1.0 g |
| | Zirconium acetylaceonate | 4.09 g | | | |
| $LaAlO_3$ | $La(NO_3)_3 \cdot 6H_2O$ | 4.33 g | 16.0 g | 80 g | 1.0 g |
| | $Al(NO)_3 \cdot 9H_2O$ | 3.75 g | | | |

Further modifications will occur to those skilled in the art and such are considered to fail within the spirit and scope of the invention as defined in the appended claims.

What is claimed is:

1. A semiconductor wafer suitable for MOS deposition upon a surface thereof comprising a thin insulating metal oxide buffer layer adhered to said surface and compatible with MOS materials deposited thereon.

2. A coated/buffered semiconductor wafer as claimed in claim 1 and in which said metal oxide buffer layer was formed from a PMC precursor and is of the order of microns in thickness.

3. A coated/buffered semiconductor wafer as claimed in claim 2 and in which the buffer layer insulating metal oxide is selected from the group consisting of MgO, $LaGaO_3$, $SrTiO_3$, $NdGaO_3$, GdGa, YSZ and $LaAlO_3$, and the semiconductor is one of Si and GaAs.

4. A method of buffering semiconductor wafers from undesirable chemical interaction with metal oxide superconducting (MOS) materials to be deposited upon a surface thereof, that comprises, applying to the semiconductor wafer surface a coating of polymer-metal-complex (PMC) to form thereon a corresponding insulating metal oxide thin layer adhered to the said wafer surface and non-reactive therewith, said layer to receive MOS deposition thereupon and buffering the same from reaction with the wafer surface.

5. A method as claimed in claim 4 and in which the semiconductor is silicon and the insulating metal oxide buffer layer is selected from the group consisting of MgO, $LaGaO_3$, $SrTiO_3$, $NdGaO_3$, GdGa, YSZ and $LaAlO_3$.

6. A method as claimed in claim 5 and in which said metal oxide buffer layer is formed in the micron thickness range.

7. A method as claimed in claim 6 and in which said thickness is in the range of 0.1 to 10 $\mu$m.

8. A semiconductor wafer formed by the process of claim 4.

9. A method as claimed in claim 1 and in which the (MOS) material is prepared from a polymer-metal-complex (PMC) precursor including metals selected from the group consisting of Y, Ba, Bi, Sr, Ca, Ti, Pb, Ag and Cu intermixed with a thermally stable heteroatom resist polymer comprising successive aromatic rings with intervening structures that render the same sensitive to and unstable in the presence of radiation and selected from the group consisting of amic acid, imide, imidazole, oxadiazole, triazole and oxazole and their respective precursors, with the said material converted by oxidation to (MOS) characteristics following irradiation of the same to create the desired (MOS) conductor pattern.

* * * * *